United States Patent [19]
Bill et al.

[11] Patent Number: 5,675,537
[45] Date of Patent: Oct. 7, 1997

[54] ERASE METHOD FOR PAGE MODE MULTIPLE BITS-PER-CELL FLASH EEPROM

[75] Inventors: Colin Stewart Bill, Cupertino; Jonathan Shichang Su, Sunnyvale; Ravi Prakash Gutala, Santa Clara, all of Calif.

[73] Assignee: Advanced Micro Devices, Inc., Sunnyvale, Calif.

[21] Appl. No.: 701,288

[22] Filed: Aug. 22, 1996

[51] Int. Cl.$^6$ ................................................ G11C 11/34
[52] U.S. Cl. ...................... 365/185.22; 365/185.29; 365/185.3
[58] Field of Search ...................... 365/185.22, 185.29, 365/185.3

Primary Examiner—David C. Nelms
Assistant Examiner—F. Niranjan
Attorney, Agent, or Firm—Davis Chin

[57] ABSTRACT

An improved erasing structure for performing a programming back operation and a concurrent verify operation subsequent to application of an erasing pulse in an array of multiple bits-per-cell flash EEPROM memory cells is provided. A memory core array (12) includes a plurality of memory cells and an erase verify reference cell array for generating an upper erased state threshold voltage level. A pre-charge circuit (36a) is used to pre-charge all the array bit lines to a predetermined potential prior to a programming back operation. A reference generator circuit (134) is used for generating a reference output voltage corresponding to a lower erased state threshold voltage level. A switching circuit (P1, N1) is used to selectively disconnect a program current source of approximately 5 µA from the selected certain ones of the columns of array bit lines containing the selected memory core cells which have been correctly programmed back. A sense logic circuit (26, 27) continuously compares a potential on one of the selected bit lines and the reference output voltage corresponding to the lower erase threshold voltage level. The sensing logic circuit generates a logic signal which is switched to a low logic level when the potential on the selected bit line falls below the bit line voltage corresponding to the lower erased state threshold voltage level. The switching circuit is responsive to the low logic level for disconnecting the programming current source so as to inhibit further programming back of the selected memory core cells.

14 Claims, 5 Drawing Sheets

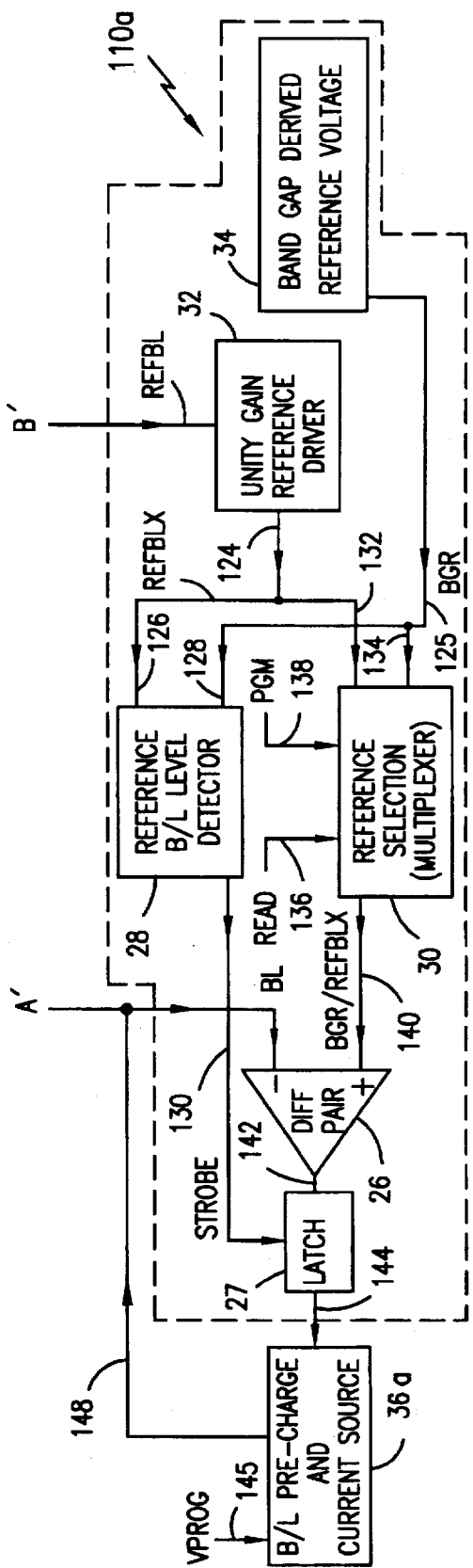
Fig. 3B
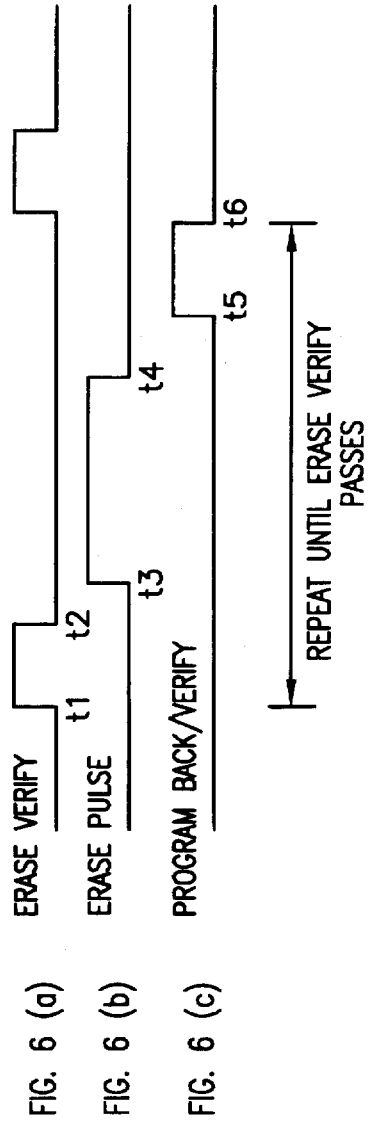
FIG. 6 (a)
FIG. 6 (b)
FIG. 6 (c)
Fig. 6

ERASE METHOD FOR PAGE MODE MULTIPLE BITS-PER-CELL FLASH EEPROM

BACKGROUND OF THE INVENTION

1. Field of the Invention

This invention relates generally to floating gate memory devices such as an array of flash electrically, erasable programmable read-only memory (EEPROM) cells. More particularly, it relates to a semiconductor integrated circuit memory device having an improved erasing scheme for performing an erasing operation in an array of two bits-per-cell flash EEPROM memory cells on a more effective and efficient basis.

2. Description of the Prior Art

As is generally known in the art, a new category of electrically erasable EPROMs/EEPROMs has emerged in recent years as an important non-volatile memory which combines the advantages of EPROM density with EEPROM electrical erasability and is sometimes referred to as "Flash" EPROM or EEPROM. In these conventional (single density) flash memory devices, a plurality of one-transistor flash EEPROM core cells may be formed on a semiconductor substrate in which each cell is comprised of a P-type conductivity substrate, an N-type conductivity source region formed integrally with the substrate, and an N-type conductivity drain region also formed integrally within the substrate. A floating gate is separated from the substrate by a thin dielectric layer. A second dielectric layer separates a control gate from the floating gate. A P-type channel region in the substrate separates the source and drain regions.

In order to program the flash EEPROM cell in conventional operation, the drain region and the control gate are raised to predetermined potentials above the potential applied to the source region. For example, the drain region has applied thereto a voltage $V_D$ of approximately +5.5 volts with the control gate $V_G$ having a voltage of approximately +9 volts applied thereto. These voltages produce "hot electrons" which are accelerated across the thin dielectric layer and onto the floating gate. This hot electron injection results in an increase of the floating gate threshold by approximately two to four volts.

For erasing the flash EEPROM cell in conventional operation, a positive potential (e.g., +5 volts) is applied to the source region. The control gate is applied with a negative potential (e.g., −8 volts), and the drain region is allowed to float. A strong electric field develops between the floating gate and the source region, and a negative charge is extracted from the floating gate to the source region by way of Fowler-Nordheim tunnelling.

In order to determine whether the flash EEPROM cell has been properly programmed or not, the magnitude of the read current is measured. Typically, in the read mode of operation the source region is held at a ground potential (0 volts) and the control gate is held at a potential of about +5 volts. The drain region is held at a potential between +1 to +2 volts. Under these conditions, an unprogrammed cell (storing a logic "1") will conduct a current level of approximately 50 to 100 μA. The programmed cell (storing a logic "0") will have considerably less current flow.

These flash memory core cells are typically manufactured in the form of an N×M matrix or array on a single chip where N equals the number of rows and M equals the number of columns. All of the individual core cells in the memory array are accessed by a row decoder and a column decoder so as to address a particular core cell. A sense amplifier is built in the semiconductor chip for sensing the memory state of the selected core cell when addressed by the row decoder and column decoder. In recent years, such flash memories have been fabricated with progressively higher and higher bit densities and smaller cell sizes as the density of semiconductor integrated circuit memories increases. For example, memory devices having 16 megabits (approximately 16 million memory cells) density or more are now being mass produced.

In co-pending application Ser. No. 08/688,795 filed Jun. 24, 1996 and entitled "A Method for Multiple Bits-Per-Cell Flash EEPROM With Page Mode Program and Read" (attorney Docket No. 95A-1763) which is assigned to the same assignee as the present invention, there is illustrated and described a novel reading scheme for two bits-per-cell flash EEPROM memory cells in which the reference core cells were previously programmed to corresponding ones of a plurality of reference cell threshold voltages at the same time the memory core cells were programmed to one of a plurality of memory core threshold voltages. The reference core cells are embedded and associated with every page in the memory core array so that they can be concurrently programmed when the memory core cells are being programmed in parallel, e.g., 128 bytes at a time. A read circuit responsive to a strobe signal is used to compare the memory threshold voltage of the selected memory core cell in a page with each of the reference cell threshold voltages so as to determine which one of the plurality of memory states the selected memory cell is storing.

In co-pending application Ser. No. 08/635,995, filed Apr. 22, 1996, and entitled "A Method for Page Mode Programming Multiple Bits-Per-Cell Flash EEPROM" (attorney Docket No. 95A-1764) which is also assigned to the same assignee as the present invention, there is described the details of a unique programming technique for page programming simultaneously of the selected memory core cells and the reference core cells. A master bandgap reference generator circuit is used to selectively generate one of a plurality of target memory core bit line program-verify voltages, each one corresponding to one of the programmable memory states. A switching circuit selectively connects a program current source to the array bit lines containing the selected memory core cells which are to be programmed. A sensing logic circuit compares continuously the potential on the array bit line with one of the target bit line program-verify voltages. The switching circuit disconnects the programmed current source so as to inhibit further programming when the potential on the bit line falls below the selected one of the plurality of target bit line program-verify voltages.

In U.S. Pat. No. 5,172,338 to S. Mehrotra et al. issued on Dec. 15, 1992, there is disclosed an EEPROM array which includes circuits and techniques for read, write and erase so as to provide multiple threshold levels in order to allow for accurate reading and writing of more than two distinct states within each memory cell. This '338 patent is hereby incorporated by reference in its entirety. A set of threshold voltages is provided by a corresponding set of reference cells, acting as a master reference, which closely tracks and makes adjustments for the variations presented by the memory cells. The master reference cells are independently and externally programmable by either the memory manufacturer or the user through software control. During a read operation, the memory state of the memory cell is obtained by comparing the current flowing therethrough with that of the set of reference currents in the reference cells corresponding to multiple threshold breakpoint levels. During an erase operation, an erased state of the memory cell is obtained by repetitive steps of erasing and verifying from the existing state to the erased state. A circuit verifies the erased state after each erasing step with the erased state and selectively inhibits further erasing of any memory cells that have been verified to have been erased correctly.

Nevertheless, there has arisen a need to provide an improved erasing scheme for performing the erasing operation in an array of two bits-per-cell flash EEPROM cells so as to render enhanced efficiency. The present invention represents a significant improvement over the aforementioned U.S. Patent No. 5,172,338.

SUMMARY OF THE INVENTION

Accordingly, it is a general object of the present invention to provide an improved erasing method and circuitry for two bits-per-cell flash EEPROM cells which is relatively simple in its construction, easier to manufacture, and has a tighter erased state threshold distribution over the prior art erasing techniques.

It is an object of the present invention to provide a semiconductor integrated circuit memory device having an improved erasing scheme for performing an erasing operation in an array of two bits-per-cell EEPROM memory cells so as to achieve a very tight erased state threshold distribution.

It is another object of the present invention to provide an improved erasing method for two bits-per-cell flash EEPROM memory cells which utilize Fowler-Nordheim tunnelling to discharge the floating gate and subsequent hot carrier injection of electrons for programming back at low drain current levels to obtain an accurate final erased state threshold distribution.

It is still another object of the present invention to provide an improved erasing method and circuitry for two bits-per-cell flash EEPROM memory cells in which erase verify reference cells having an upper erased state threshold level are used when the selected memory core cells are being erase verified.

It is yet still another object of the present invention to provide an improved erasing method and circuitry for programming back two bits-per-cell flash EEPROM memory cells and for concurrently verifying a lower erased state threshold level in the selected memory cells subsequent to an erase pulse being applied.

In accordance with the preferred embodiment of the present invention, there is provided an improved erasing structure for performing a programming back operation and a concurrent program verify operation subsequent to application of an erasing pulse in an array of multiple bits-per-cell flash EEPROM memory cells on a more effective and efficient basis. A memory core array includes a plurality of memory cells arranged in rows of wordlines and columns of bit lines intersecting the rows of wordlines. Each of the memory cells includes a floating gate array transistor. A wordline rise-time control the circuit is used to generate a control signal to control the rise-time of voltages on the wordlines. A row decoder is responsive to the control signal and row address signals and is operatively connected to the memory core array for selecting certain ones of the rows of wordlines. A column decoder is responsive to column address signals and is operatively connected to the memory core array for selecting certain ones of the columns of bit lines. An erase verify reference cell array is provided to generate an upper erased state threshold voltage level. An erase verify decoder is responsive to the rise-time control signal for controlling the wordline of the erase verify reference cell array. A pre-charging circuit is provided for initially pre-charging all of the array bit lines to a predetermined level prior to a programming back operation.

A reference voltage generator is provided for generating a reference output voltage corresponding to a lower erased state threshold voltage level. A switching circuit is provided for selectively disconnecting a program current source from the selected certain ones of the columns of array bit lines containing the selected memory core cells which have been correctly programmed back. A sensing logic circuit has a first input coupled to the reference output voltage of the reference voltage generator circuit and a second input coupled to the selected certain ones of the columns of array bit lines for continuously comparing a potential on one of the selected bit lines and the corresponding lower erased state bit line voltage generated by the reference voltage generator circuit.

The sensing logic circuit has an output for generating a logic signal. The logic signal switches to a low logic level when the potential on the selected bit line falls below the reference output voltage corresponding to the lower erased state threshold voltage level during program back operation. The switching circuit is responsive to the low logic level for disconnecting the program current source so as to inhibit further programming back of the selected memory core cells.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIGS. 3A and 3B, when connected together, is a simplified block diagram of the erased verify reference cell array circuitry 25, associated read circuitry 110a, and programming back circuit 36 of FIG. 1;

FIGS. 6(a) through 6(c) are waveforms illustrating the timing sequence of the erase mode of operation, including the erase verify, erase pulse, and program back/verify operations.

DESCRIPTION OF THE PREFERRED EMBODIMENT

An improved erasing structure for performing an erasing operation in an array of two bits-per-cell flash EEPROM memory cells is described. In the following description, numerous details are set forth, such as specific circuit configurations, components and the like in order to provide a thorough understanding of the present invention. However, it should be apparent to those skilled in the art that the present invention may be practiced without these specific details. In other instances, well-known processes, circuits, and control lines not particularly relevant to the understanding of the operating principles of the present invention, have been purposely omitted for the sake of clarity.

Figure 1:
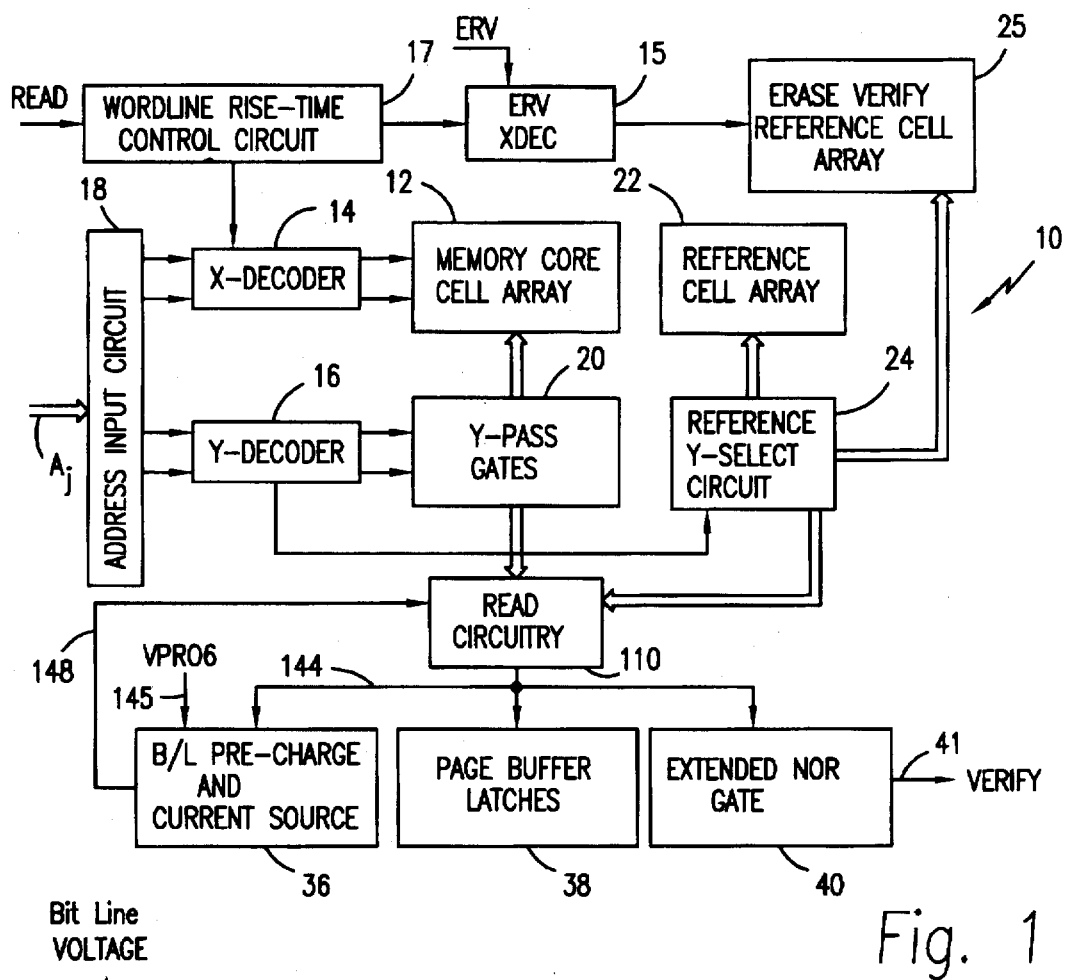
FIG. 1 is a block diagram of a two-bits-per cell semiconductor integrated circuit memory device having improved erasing scheme and circuitry, constructed in accordance with the principles of the present invention.

Referring now in detail to the drawings, there is shown in FIG. 1 a block diagram of a two bits-per-cell semiconductor integrated circuit memory device 10 which includes an improved erasing circuitry of the present invention for performing an erasing operation in an array of two bits-per-cell flash electrically erasable read-only memory (EEPROM) cells of the memory device on a more effective and efficient basis. The improved erasing circuitry and the remaining portions of the memory device 10 are both wholly formed on a single semiconductor substrate by known CMOS integrated circuit technology.

The two bits-per-cell semiconductor integrated circuit memory device 10 includes a memory core cell array 12, a row address decoder 14, an erase verify decoder 15, a column address decoder 16, a wordline rise-time control circuit 17, an address input circuit 18, a Y-pass gate circuit 20, a reference cell array 22, a reference Y-select circuit 24, an erase verify reference cell array 25, read circuitry 110, bit line pre-charge and current source circuitry 36, page buffer latches 38, and extended NOR gate circuit 40. The memory core cell array 12 includes approximately 16 million core cells arranged in a regular matrix pattern of $2^{12}$ rows and $2^{12}$ columns. Preferably, groups of columns are formed such that each group defines a page. Each page represents a number of bytes of data. For instance, the $2^{12}$ columns may be divided into four pages so that each page will contain 1024 cells. Further, a predetermined number of rows may be grouped together so as to form a sector defining a selectable block. For example, the $2^{12}$ rows may be divided into 64 sectors so that each sector will be composed of 64 rows. Thus, each sector will consists of 256K cells, corresponding to 512K bits of data stored with two bits-per-cell. For the two bits-per-cell memory device 10, the 16 Mb flash memory cells can actually store 32 Mb of data since two bits of data per cell is being stored in order to provide a double density storing capacity.

By an erasing mode of operation of the present invention, each of the memory core cells has its threshold voltage set in an erased state having an erased threshold window defined between upper and lower erased threshold levels. This is achieved by initially performing an erase verify operation, which is similar to the reading scheme described and illustrated in aforementioned co-pending application Ser. No. 08/688,795 filed Jun. 24, 1996 to determine if there are any memory core cells that need to be erased (i.e., cells having a threshold level higher than the upper erased threshold level). If one or more cells are found to exist that require erasing, an erase pulse is applied using a negative gate erase in accordance with conventional Fowler-Nordheim tunnelling so as to discharge the charges on the floating gate of the memory core cells. Thereafter, a programming back operation is performed and is concurrently verified to the lower erased threshold voltage level to obtain an accurate placement of the final erase threshold voltage distribution. This programming back operation is similar to the programming and concurrent verify technique described and illustrated in aforementioned co-pending application Ser. No. 08/635,995 filed Apr. 22, 1996. Only the cells having a threshold voltage below the lower erased threshold level (PGMVT0 in FIG. 2) will be programmed back and any cells having a threshold voltage above the lower erased threshold PGMVT0 level will be inhibited from further programming back. This cycle of erase verify, erase pulse, programming back/verify is repeated over and over until all of the threshold voltages of the memory cells in the page fall between the upper and lower erased threshold voltage levels. The cycle will terminate after a successful erase verify operation.

Figure 2:
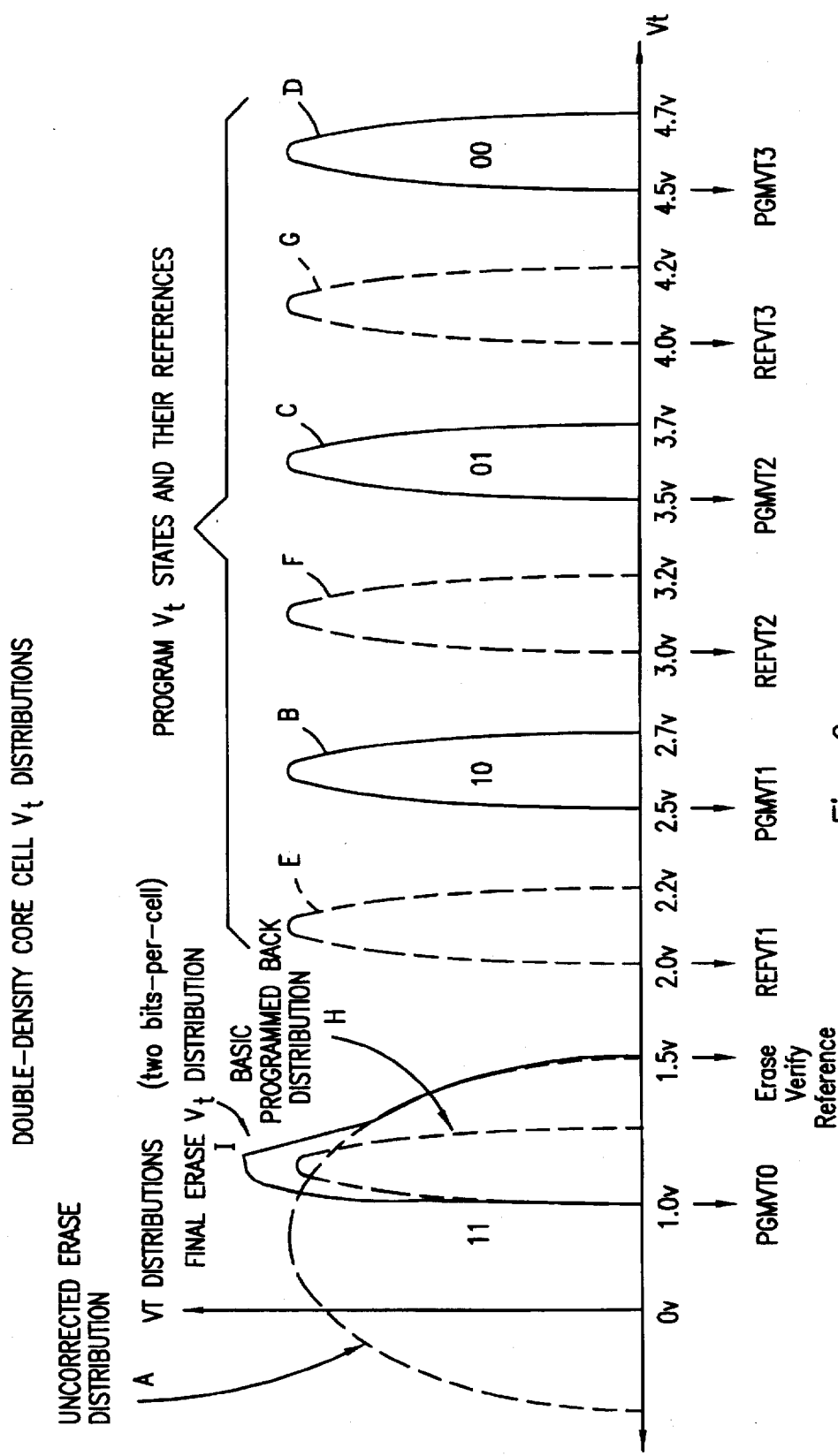
FIG. 2 is a graph of the erased state for a cell storing two bits-per-cell and the corresponding uncorrected erased threshold voltage distribution, corrected programmed back threshold voltage distribution, and the final combined erased threshold voltage distribution.

In FIG. 2, there is shown a graph of the erased state for the double density memory cells. As can be seen, the dotted curve A shows the uncorrected threshold voltage distribution for the memory core cells in the erased state or corresponding to storing data or logic "11". The threshold window of the uncorrected erased state is in the range of +1.5 V (erase verify reference) defining the upper erased threshold level to below 0 V (e.g., −0.5 V). The dotted curve H shows the corrected programmed back threshold voltage distribution for the memory core cells in which only the cells having a threshold voltage below +1.0 V (PGMVT0) defining the lower erased threshold level are programmed back to have a threshold level equal to or above +1.0 V. Thus, the corrected programmed back threshold voltages are in the range between +1.0 V and approximately +1.2 V. The solid curve I is the final combined erase threshold voltage distribution which is obtained by adding the portion of the curve A which is higher than +1.0 V and the curve H. The final combined erased threshold voltage distribution has an erased threshold window, which is in the range of 1.0 V and +1.5 V. For ease of comparison, the solid curves B, C and D showing the threshold voltage distribution for the three programmed states PGMVT1, PGMVT2, and PGMVT3 and the dotted curves E, F and G showing the threshold voltage distribution for the three reference cells REFVT1, REFVT2, and REFVT3 are depicted, which are described in detail in Ser. No. 08/635,995 filed Apr. 22, 1996.

Unlike the prior art erasing method having an erased threshold distribution of approximately 2.0 volts, the novel erasing method of the present invention provides a tighter final combined erased threshold voltage distribution, e.g., approximately 0.5 volts. This has the advantage that the possible number of bits of data that each memory cell stores can be thus increased. In the alternative, the number of bits of data can remain the same with a higher voltage separation between adjacent states thereby improving its reading speed and accuracy.

Address signals $A_j$ are externally applied to the address input circuit 18. The row address signals from the address input circuit 18 are fed to the row address decoder 14, and the column address signals thereof are fed to the column address decoder 16. The row address decoder 14 selects certain ones of the plurality of wordlines in the memory core array 12 in response to the row address signals. The column address decoder 16 selects one of the pages in the memory core array in response to the column address signals. The wordline risetime control circuit 17 is responsive to a read signal READ for generating an output control signal to the erase verify decoder 15 and the row address decoder 16. The erase verify decoder 15 is also responsive to an erase verify signal ERV. The output of the erase verify decoder 15 is connected to the erase verify reference cell array 25.

During the erase verify operation, the Y-pass gate circuit 20 connects all of the array bit lines in the selected page with the read circuitry 110 and the reference Y-select circuit 24 connects all of the corresponding erase verify bit lines of the erase verify reference cell array 25 associated with the selected page to the read circuitry 110. Thus, the erase verify operation is substantially identical to the read method described in Ser. No. 08/688,795 filed Jun. 24, 1996, except that the erase verify reference cell array 25 is used instead of the reference cell array 22.

Figure 3A:
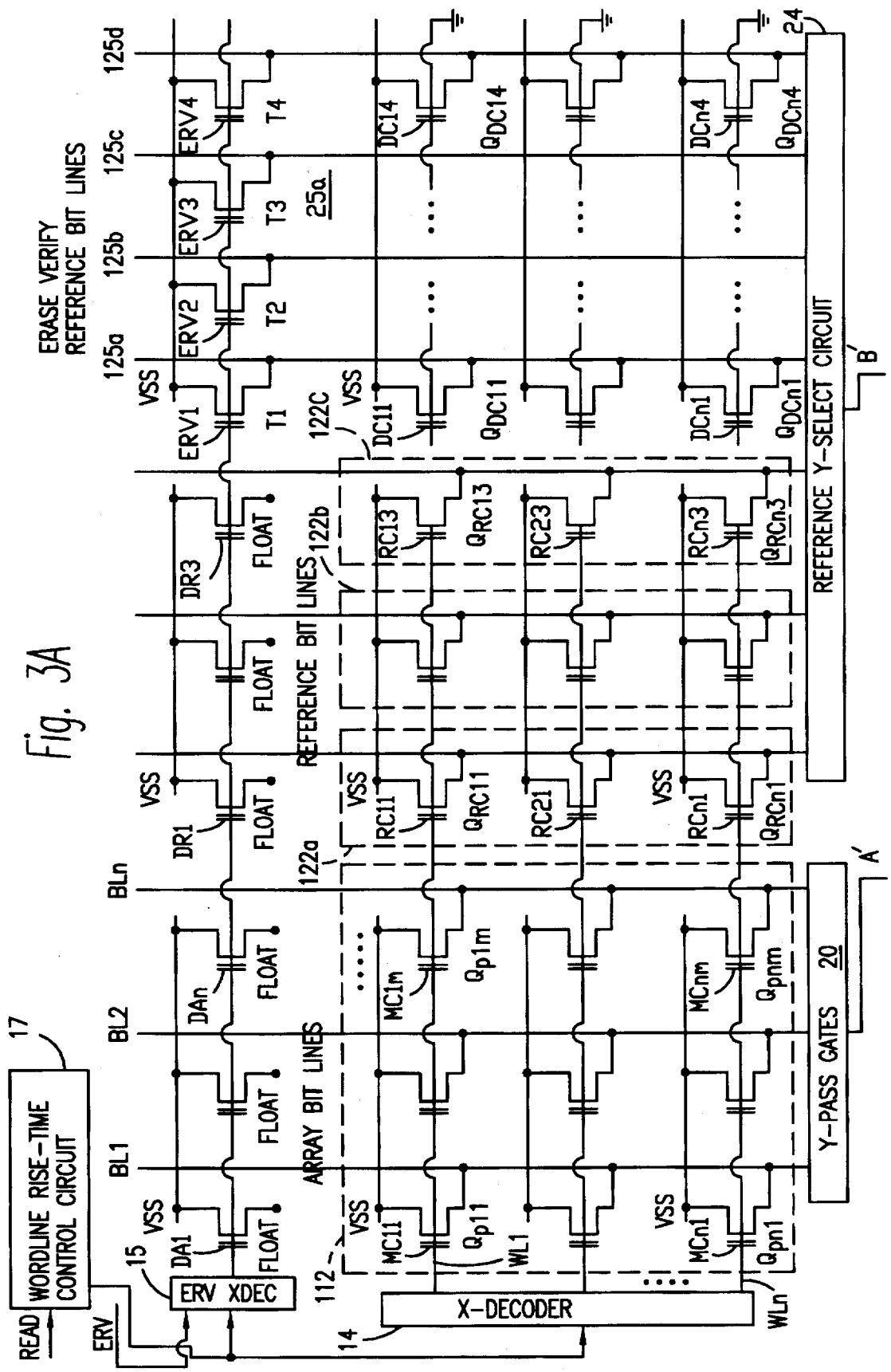

In FIGS. 3A and 3B, there is illustrated a simplified block diagram of a portion of the erase verify reference cell array 25a in FIG. 1 for use with a sector array 112 of the array 12 with associated reference columns 122a–122c of the reference cell array 22 and with associated erase verify reference columns 125a–125d of the array 25a. As can be seen, the memory core cells MC11 through MCnm of the sector array 112 are arranged in the form of a matrix. The number n is equal to 64 for a sector, and the number m is equal to 1024 for a page containing 256 bytes of two bits-per-cell data.

Each of the memory core cells MC11 through MCnm is comprised of one of the corresponding array floating gate transistors $Q_{P11}$–$Q_{Pnm}$. The array transistors $Q_{P11}$–$Q_{Pnm}$ function as a memory transistor for storing data or logic levels "11", "10", "01", or "00" therein. Each of the array transistors has its gate connected to one of the wordlines, its drain/source connected to one of the bit lines, and its source/drain connected to a page common array ground line VSS.

The reference cell array 22 includes a plurality of sets of reference columns. The reference column 122a is comprised of a plurality of reference cells $RC_{11}$, $RC_{21}$, ... $RC_{n1}$. Each of the reference cells $RC_{11}$–$RC_{n1}$ is comprised of one of the corresponding reference cell transistors $Q_{R11}$–$Q_{Rn1}$. Similarly, the reference column 122b is comprised of a plurality of reference cells $RC_{12}$, $RC_{22}$, ... $RC_{n2}$. Each of the reference cells $RC_{12}$–$RC_{n2}$ is comprised of one of the corresponding reference cell transistors $Q_{R12}$–$Q_{Rn2}$. Finally, the reference column 122c is comprised of a plurality of reference cells $RC_{13}$, $RC_{23}$, ... $RC_{n3}$. Each of the reference cells $RC_{13}$–$RC_{n3}$ is comprised of one of the corresponding reference cell transistors $Q_{R13}$–$Q_{Rn3}$.

The erase verify reference cell array 25a includes a plurality of sets of erase verify reference columns 125a through 125d. The erase verify reference column 125a is comprised of an erase verify reference cell ERV1 and a plurality of dummy erase verify cells $DC_{11}$, $DC_{21}$, ... $DC_{n1}$. Each of the dummy erase verify reference cells $DC_{11}$–$DC_{n1}$ is comprised of one of the corresponding dummy reference cell transistors $Q_{DC11}$–$Q_{DCn1}$. Similarly, the erase verify reference column 125d is comprised of an erase verify reference cell ERV4 and a plurality of dummy erase verify reference cells $DC_{14}$–$DC_{n4}$. Each of the dummy erase reference cells $DC_{14}$–$DC_{n4}$ is comprised of one of corresponding dummy reference cell transistors $Q_{DC14}$–$Q_{DCn4}$. The gates of the dummy erase reference cell transistors located in the same row as the gates of the array transistors in the page are connected to a ground potential. For example, the gates of the array transistors $Q_{P11}$–$Q_{P1m}$ are connected to the same wordline $WL_1$ and the gates of the dummy erase reference cell transistors $Q_{DC11}$–$Q_{DC14}$ are grounded. Likewise, the erase verify reference cells ERV1–ERV4 is comprised of one of the corresponding erase verify reference cell transistors T1 through T4. The erase verify reference array transistors T1–T4 function as a memory transistor for storing the erased state or logic "11". This is defined by the upper erased threshold voltage level that is pre-set during manufacturing, which is typically at +1.5 volts.

It should be apparent to those skilled in the art that any number of erase verify reference columns could be used. In the present embodiment, four such columns have been used so as to provide an average of four threshold voltages of the transistors T1–T4, thereby maintaining more accurately the upper erased threshold voltage level at +1.5 volts. However, a single erase verify reference cell such as ERV1 could be used. Further, it will be noted that the dummy erase verify reference cells $DC_{11}$ through $DC_{n4}$ and the dummy erase verify reference cells DA1–DAn and DR1–DR3 associated with the respective array bit lines and reference bit lines appearing in the same row as the erase verify reference cells ERV1–ERV4 are for topological reasons, and it is only the erase verify reference cells ERV1–ERV4 that are active.

The read circuitry 110a includes a differential pair amplifier 26, a latch 27, a reference bit line level detector 28, a reference selection circuit 30, a unity gain reference driver 32, and a bandgap reference generator 34. As can be seen, the unity gain reference driver 32 has its input connected to a common reference bit line REFBL and has its output on line 124 for providing an erase verify reference bit line voltage REFBLX during the erase verify operation. This voltage REFBLX depends upon the upper erased state threshold level. Since the resistance and capacitance of the array bit lines and the erase verify reference bit lines are closely matched, the unity gain reference driver 32 serves to buffer the erase verify reference bit line and supplies a 1-to-1 voltage translation with minimal phase lag to the differential pair amplifier 26. During the programming back and concurrent verify mode of operation, the bandgap generator 34 is used to produce a very stable bandgap reference derived voltage BGR on line 125, equal to the target program back-verify voltage PGM0 in FIG. 4 (corresponding to the lower erased state threshold level).

During the programming back operation, the program enable signal PGM on line 138 is active and will cause the reference selection circuit 30 to deliver the bandgap reference derived voltage BGR on its input to its output on line 140. The differential pair amplifier 26 functioning as a comparator has its non-inverting input connected to receive the bandgap reference derived voltage BGR and its inverting input connected to receive the array bit line voltage BL. The differential amplifier 26 consists of a sense amplifier and has its output driving the latch 27. At the time of programming back, the verify mode of operation is being performed concurrently or simultaneously. Thus, the differential pair amplifier 26 is used to monitor the voltage on the bit line BL as the programming back operation progresses.

Figure 4:
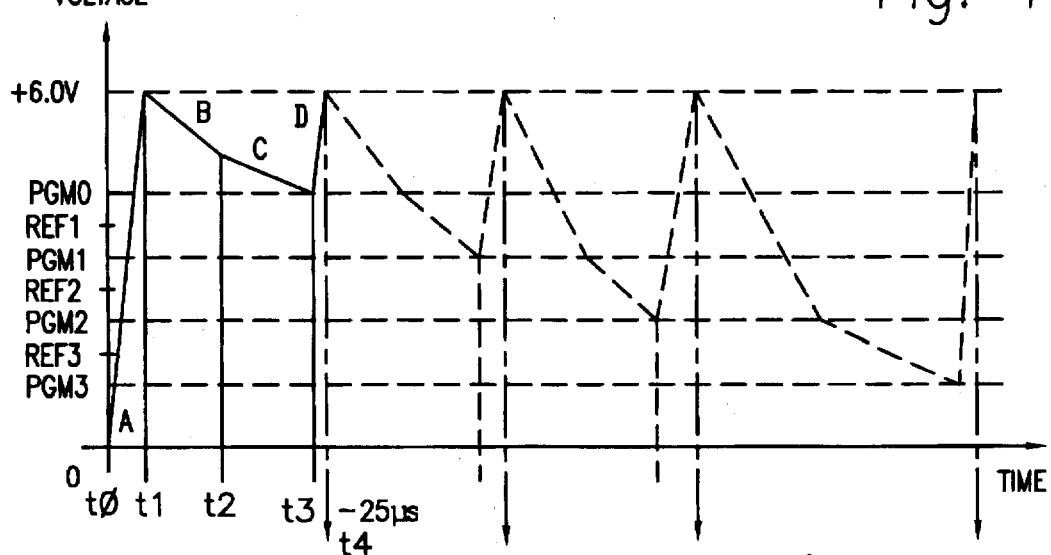
FIG. 4 is a graph of the bit line voltage as a function of the programming back time after the erase pulse corresponding to the erased state "11" of FIG. 2, useful in understanding the programming back operation of the present invention.

If the voltage on the selected bit line connected to the memory cell to be programmed back is greater than the bandgap reference derived voltage BGR corresponding to the target program back-verify voltage PGM0 in FIG. 4, the output of the differential pair amplifier 26 on line 142 will be low and the latch 27 will store a logic "1" on its output terminal on line 144. In response to this logic "1", the program current source circuitry 36a will maintain a programming current of approximately 5 µA to flow in the bit line. When the voltage of the bit line BL becomes less than the bandgap reference derived voltage BGR due to the accumulation of negative charges on the floating gate of the cell, the output of the differential pair amplifier 26 will be switched high and the latch will store a logic "0" on its output. In response to this logic "0", the program current source circuitry 36a will cause the current source to be turned off and the program inhibit high voltage PROG on line 145 will be connected to the bit line so as to inhibit further programming back.

Figure 5:
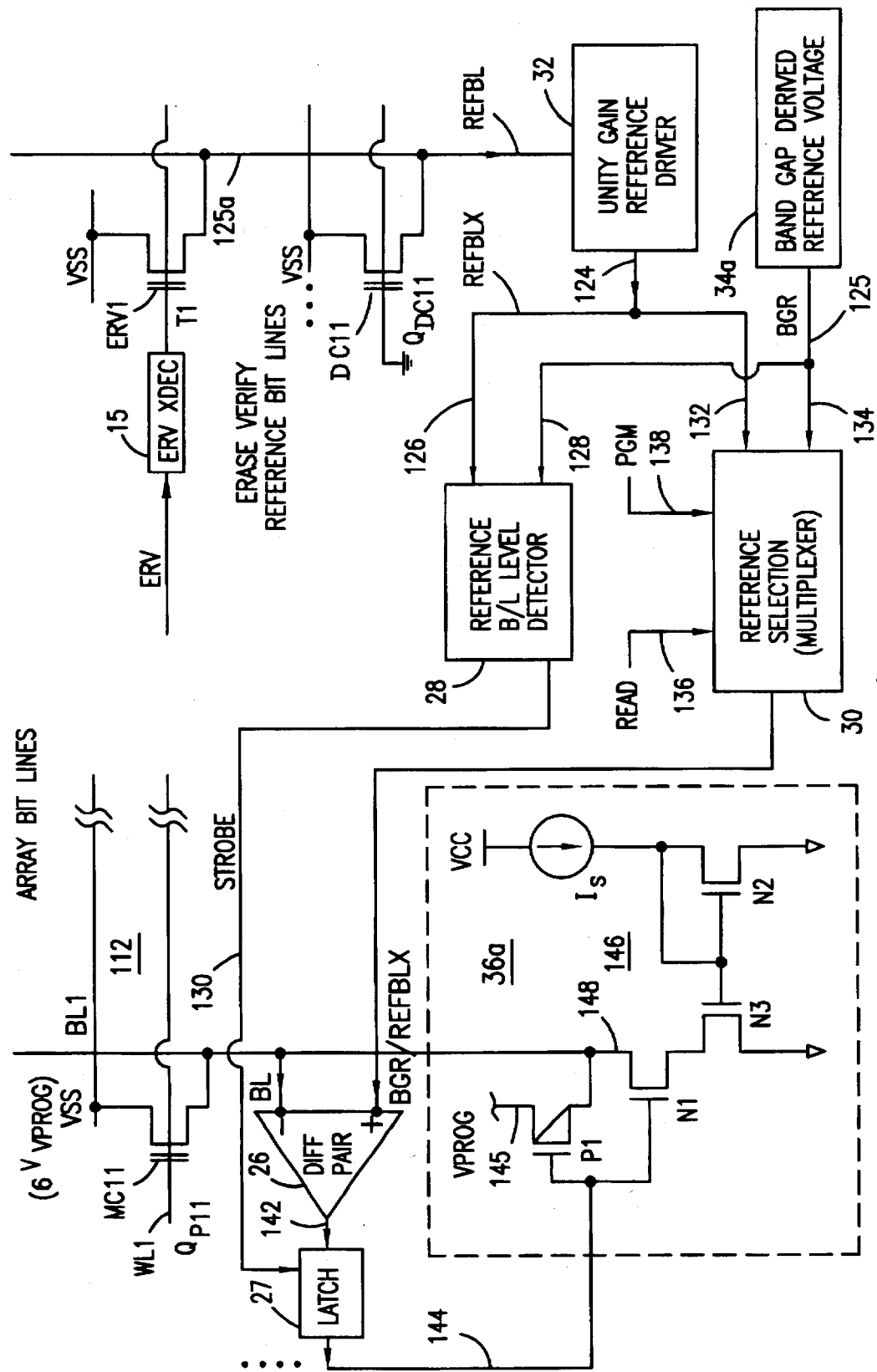
FIG. 5 is a schematic circuit diagram of the programming back circuitry 36a associated with the individual bit lines of a multiple page buffer containing the selected memory core cell desired to be erased in the memory array portion 112 of FIG. 3.

In FIG. 5, there is illustrated a schematic circuit diagram of a portion of the program current source circuitry 36a in FIG. 3 for use with one array bit line $BL_1$ within the page (i.e., $WL_1$ of array 112) of the memory core array 12 and with one erase verify reference bit line 125a of the associated erase verify reference cell array 25a. The program current source circuitry 36a is comprised of a transistor switch N1, a pull-up transistor P1, and a current mirror arrangement 146. The transistor switch N1 has its drain connected to the array bit line $BL_1$ via line 148 defining the output of the program current source circuitry 36a and its gate connected to the gate of the pull-up transistor P1. The pull-up transistor P1 has its source connected to the program inhibit high voltage VPROG via the line 145 which is approximately +5 V to +6 V and has its drain connected also to the output line 148.

The current mirror arrangement 146 consists of a current source I for producing a current sink of approximately 5 μA and a pair of mirror transistors N2 and N3. The current source $I_S$ has its one end connected to a power supply potential VCC, which is approximately +3 V, and has its other end connected to the drain and gate of the transistor N2. The gate of the transistor N2 is also connected to the gate of the transistor N3. The sources of the transistors N2 and N3 are connected to a ground potential. The drain of the transistor N3 is connected to the source of the transistor switch N1.

The novel programming back and concurrent verify method of the present invention for the multiple bits-per-cell memory array 112 of FIG. 3 will now be explained in detail with reference to FIGS. 2 and 4–6. For the sake of simplicity and purposes of illustration, it will be assumed that the memory core cell $MC_{11}$ has been previously programmed to one of the target programmed levels or states PGMVT1, PGMVT2, or PGMVT3 as shown in FIG. 2 and that it is now desired to erase verify, apply an erase pulse, and program back/verify the erased memory cell to the lower target erased state threshold level PGMVT0. The complete erasing mode of operation will be performed in accordance with FIGS. 6(a) through 6(c).

Since the initial state of the memory core cell $MC_{11}$ will have a threshold level above the upper target erased state threshold level, an erase verify operation is performed between times t1 and t2 as illustrated in FIG. 6(a) in order to check that the memory cell indeed is above the upper target erased state threshold voltage. It will be noted that this erase verify operation is substantially identical to the read operation as described and illustrated in co-pending application Ser. No. 08/688,795 filed Jun. 24, 1996, except that the erase verify reference bit lines are used instead of the reference bit lines. Assuming that the memory cell $MC_{11}$ is verified to be above the upper target erased state threshold level, then an erase-pulse is applied between times t3 and t4 as illustrated in FIG. 6(b) utilizing the conventional Fowler-Nordheim tunnelling so as to discharge the charges on the floating gate of the core cell transistor $Q_{P11}$. This may cause the threshold voltage level of the memory cell to be shifted to below the lower erased state threshold level PGMVT0 in FIG. 2. The upper erased state is the highest threshold after a successful erase verify operation. The lower erased state is the lowest threshold within the erase distribution after the program back/verify operation.

A re-programming or programming back and concurrent verify operation is performed between times t5 and t6 only if the threshold level of the memory cell is below PGMVT0. If the memory cell is below the level PGMVT0, then it is programmed back to the PGMVT0 level. It will be noted that this programming back and concurrent verify is substantially identical to the programming operation described in co-pending application Ser. No. 08/635,995 filed Apr. 22, 1996. If the threshold level of the memory cell is above the PGMVT0 level, it will be unaffected by the programming back operation. During erase, 64K bytes of cells are actually erased together (1 sector). This sequence of erase verify, erase pulse, and programming back/verify is repeated over and over until all of the threshold levels of all the memory cells in the sector array fall between +1.5 V and +1.0 V.

Prior to the programming back/verify operation, the bit line precharging circuit portion of the circuitry 36a is used to initially pre-charge all of the array bit lines and the common array ground line VSS to the program voltage VPROG, which is approximately +5 V to +6 V. As shown in FIG. 4, the bit line $BL_1$ is thus precharged to +6.0 V between the times t0 and t1 along the curve A. Then, all the current sources $I_S$ connected to the array bit lines will be switched on. The voltage on the bit line $BL_1$ will initially discharge its associated capacitance along curve B in FIG. 4 until a sufficient drain-to-source voltage $V_{DS}$ is created across the core transistor $Q_{P11}$ being programmed back, such as at time t2. At this point, the programming current begins to flow in the channel of the transistor $Q_{P11}$. The current of 5 μA flowing in the current sink transistor N3 will maintain the potential on the bit line $BL_1$ at a threshold voltage below the floating gate potential. In other words, the bit line voltage is approximately 1 threshold voltage $V_t$ drop below the poly-1 potential in the floating gate transistor $Q_{P11}$ less a small delta voltage which allows the channel current to flow.

As the voltage on the bit line continues to fall along the curve C, the differential pair amplifier 26 continuously compares this bit line voltage (corresponding to the threshold voltage of the memory cell $MC_{11}$ being programmed back) with respect to the bandgap reference derived voltage BGR (corresponding to the lower target erased state threshold level PGMVT0). It should be noted that during this programming back mode the floating gate of the memory cell transistor is being charged with electrons and thus its potential is becoming more negative. However, the threshold voltage seen as a control gate is being made more positive.

The voltage on the bit line $BL_1$ will be higher than the bandgap reference derived voltage BGR from the time t2 until the time t3. Thus, the output of the differential amplifier pair 26 will be low and a logic "1" will be stored in the latch 27. This maintains the current source $I_S$ turned on and thus programming back continues. However, at the time t3, the voltage on the bit line $BL_1$ will be less than the bandgap reference derived voltage BGR. This will cause the output of the differential amplifier pair 26 to be changed to a high state and a logic "0" will be stored in the latch 27. As a result, the pull-up transistor P1 will be turned on, which applies the program inhibit high voltage VPROG to the bit line $BL_1$, so as to inhibit further programming back at the time t4. This is also the point of verify. Accordingly, unlike the prior art, there is no separate operation to be performed for verifying the programmed back level. It should be noted that for a cell whose threshold level after the erase pulse has been applied remains above the lower target erased state threshold level PGMVT0, the corresponding bit line voltage to begin programming (i.e., the junction of the curves B and C at the time t2 in FIG. 4) would occur below the program back-verify voltage PGM0. Consequently, no programming will take place since the bit line will be inhibited before the time t2.

The information from the latch 27 is then later clocked into the shift register of a page buffer 38. An extended NOR gate circuit 40 is used for generating a signal VERIFY on line 41 which goes to a high logic level when the whole page has been verified. The details of the circuits and operations thereof for the page buffer 38 and the NOR gate circuit 40 are described and illustrated in co-pending application Ser. No. 08/669,116 filed Jun. 24, 1996, and entitled "A Multiple Bits-Per-Cell FLASH Shift Register Page Buffer" (attorney Docket No. 96A-1788) which is assigned to the same assignee as the present invention.

From the foregoing detailed description, it can thus be seen that the present invention provides an improved erasing circuitry for performing a programming back operation and a concurrent verify operation in an array of multiple bits-per-cell flash EEPROM memory cells on a more efficient and effective basis. The programming current source circuitry includes a switching circuit for selectively disconnecting a program current source from the selected certain ones of the array bit lines containing the selected memory core cells which have been correctly programmed back. A sense logic circuit continuously compares the potential on the selected bit line and a lower target erase-verify threshold voltage. The switching circuit disconnects the program current source so as to inhibit further programming back when the potential on the selected bit line falls below the lower target erase-verify voltage.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

We claim:

1. An improved erasing structure for performing a programming back operation and a concurrent verify operation subsequent to application of an erasing pulse in an array of multiple bits-per-cell flash EEPROM memory cells on a more effective and efficient basis, said erasing structure comprising in combination:

a memory core (12) having a plurality of memory cells arranged in rows of wordlines and columns of bit lines intersecting said rows of wordlines, each of said memory core cells including a floating gate array transistor having its control gate connected to one of said rows of wordlines, its drain/source connected to one of said columns of bit lines, and its source/drain connected to a common array ground line;

means (17) for generating a control signal to control the rise-time of voltages on the wordlines;

row decoder means (14) responsive to said control signals and row address signals and being operatively connected to said memory core array for selecting certain ones of said rows of word lines;

column decoder means (16, 20) responsive to column address signals and being operatively connected to said memory core array for selecting certain ones of said columns of bit lines;

erase verify reference cell array means (25) for generating an upper erased state threshold voltage level;

erase verify decoder means (15) responsive to said control signal for controlling said erase verify reference cell array means;

pre-charging means (36) for initially precharging all of said array bit lines to a predetermined potential prior to a programming back operation;

reference generator means (134) for generating a reference output voltage corresponding to a lower erased state threshold voltage level;

switching means (36a) for selectively disconnecting a program current source from the selected certain ones of said columns of bit lines containing the selected memory core cells which have been correctly programmed back;

sensing logic means (26, 27) having a first input coupled to the reference output voltage of said reference voltage generator means and having a second input coupled to one of the selected certain ones of said columns of bit lines for continuously comparing a potential on the one of the selected bit lines and said reference output voltage corresponding to the lower erased state threshold voltage level;

said sensing logic means having an output for generating a logic signal which is switched to a first logic level when said potential on said one of the selected bit lines falls below said reference output voltage corresponding to lower erased state threshold voltage level; and said switching means being responsive to said first logic level for disconnecting said program current source so as to inhibit further programming back of said selected memory core cells.

2. An improved erasing structure as claimed in claim 1, wherein a verify operation is simultaneously performed during programming back of said selected memory core cells by said sensing logic means being switched to the first logic level.

3. An improved erasing structure as claimed in claim 1, wherein said switching means (36a) is comprised of a pull-up transistor (P1), a transistor switch (N1), and a current mirror arrangement formed of first and second current mirror transistors (N2, N3), and a current source ($I_S$).

4. An improved erasing structure as claimed in claim 3, wherein said first current mirror transistor (N2) has its drain and gate connected together and to the gate of said second current mirror transistor (N3) and to a power supply potential via the current source and its source connected to a ground potential, said second current mirror transistor (N3) having its drain connected to the source of said transistor switch (N1) and its source connected to the ground potential, said pull-up transistor (P1) having its source connected to a program inhibit high voltage (VPROG), its gate connected to the gate of said transistor switch (N1) and to the output of said sensing logic means, and its drain connected to the selected bit line.

5. An improved erasing structure as claimed in claim 1, wherein said erase verify reference cell array means includes at least one erase verify reference cell transistor whose threshold is set during manufacturing to said upper erased state threshold voltage level.

6. An improved erasing structure as claimed in claim 5, wherein said upper erased state threshold voltage level is approximately +1.5 volts.

7. An improved erasing structure as claimed in claim 6, wherein said lower erased state threshold voltage level is approximately +1.0 volts.

8. An improved erasing structure as claimed in claim 1, wherein said erase verify reference cell array means is comprised of a plurality of erase verify reference cell transistors in which each threshold thereof is set during manufacturing to said upper erased state threshold voltage level.

9. An improved erasing structure as claimed in claim 8, wherein said upper erased state threshold level is approximately +1.5 volts.

10. An improved erasing structure as claimed in claim 9, wherein said lower erased state threshold voltage level is approximately +1.0 volts.

11. An improved erasing structure as claimed in claim 1, wherein said sensing means compares prior to application of an erasing pulse a potential on said columns of bit lines containing the array memory core cells and said upper erased state threshold voltage level generated by said erase verify reference cell array means to determine whether there are any memory core cells that require erasing.

12. An erasing method which includes performing a programming back operation and a concurrent verify operation subsequent to application of an erasing pulse in an array of multiple bits-per-cell flash EEPROM memory cells on a more effective and efficient basis, said erasing method comprising the steps of:

providing a memory core array having a plurality of memory cells arranged in rows or wordlines and columns of bit lines intersecting the rows of wordlines;

generating an upper erased state threshold voltage level to determine memory core cells requiring erasing;

pre-charging initially all of the array bit lines to a predetermined voltage potential prior to a programming back operation;

generating a reference voltage corresponding to a lower erased state threshold voltage level;

selectively disconnecting a program current source from the selected certain ones of the columns of array bit lines containing the selected memory core cells which have been correctly programmed back; and disconnecting the programming current source so as to inhibit further programming back of the selected memory core cells when a potential on the selected bit lines falls below the reference voltage corresponding to the lower erased state threshold voltage level.

13. An erasing method for performing a programming back operation as claimed in claim 12, further comprising the step of performing simultaneously a verify operation during programming back of the selected memory cells by disconnecting the program current source when the selected bit line falls below the reference voltage corresponding to the lower erased state threshold voltage level.

14. An erasing method for performing a programming back operation as claimed in claim 12, further comprising the step of comparing a potential on the columns of bit lines containing the array memory core cells and the upper erased state threshold voltage level prior to the application of the erasing pulse to determine whether there are any memory core cells that require erasing.

* * * * *

UNITED STATES PATENT AND TRADEMARK OFFICE
CERTIFICATE OF CORRECTION

PATENT NO. :   5,675,537
DATED      :   October 7, 1997
INVENTOR(S) :  Colin Bill It is certified that error appears in the above-indentified patent and that said Letters Patent is hereby corrected as shown below:

Column 6, line 30, change "1.0 V" to -- +1.0 V --.

Column 9, line 15, change "I" to -- $I_s$ --.

Signed and Sealed this

Twenty-third Day of December, 1997

Attest:

BRUCE LEHMAN

*Attesting Officer*        Commissioner of Patents and Trademarks